United States Patent [19]
Imai et al.

[11] Patent Number: 5,757,619
[45] Date of Patent: May 26, 1998

[54] COOLING APPARATUS FOR ELECTRONIC COMPONENTS

[75] Inventors: Yukie Imai; Minoru Takahashi; Jouji Matsumoto. all of Omiya. Japan

[73] Assignee: Mitsubishi Materials Corporation. Tokyo. Japan

[21] Appl. No.: 730,417

[22] Filed: Oct. 15, 1996

[30] Foreign Application Priority Data

Oct. 13, 1995 [JP] Japan ..................... 7-265942

[51] Int. Cl.⁶ ..................... H05K 7/20
[52] U.S. Cl. ............ 361/697; 165/80.3; 165/122; 165/185; 257/722; 415/177
[58] Field of Search ............... 165/80.3, 122, 165/125–126, 185; 174/16.3; 257/706–707, 712–713, 718, 721–722; 361/689, 690, 695–697, 704, 707, 709–710, 717–720; 415/177, 178

[56] References Cited

U.S. PATENT DOCUMENTS

| | | | |
|---|---|---|---|
| 5,309,983 | 5/1994 | Bailey | 361/697 |
| 5,544,013 | 8/1996 | Chiu | 361/697 |
| 5,582,506 | 12/1996 | Hong | 361/697 |
| 5,583,746 | 12/1996 | Wang | 361/697 |
| 5,584,339 | 12/1996 | Hong | 361/697 |

Primary Examiner—Gregory D. Thompson
Attorney, Agent, or Firm—Armstrong. Westerman. Hattori. McLeland & Naughton

[57] ABSTRACT

A cooling apparatus for electronic components comprising a plurality of radiating fins formed in a heat sink which is in contact with the electronic components, where at least one pair of the radiating fins are formed in parallel with one another. A motor for driving a fan to air-cool the electronic components fits in a groove formed by the radiating fins such that the motor axis is in the longitudinal direction of the groove. A motor-body support is provided on the radiating fins so as to support the motor fitting in the groove. A printed board is connected to a terminal of the motor and set up on the upper ends of the radiating fins, and a holding ridge is formed on the printed board for fitting in the groove so as to cooperate with the motor-body supports in clamping the motor therebetween.

2 Claims, 5 Drawing Sheets

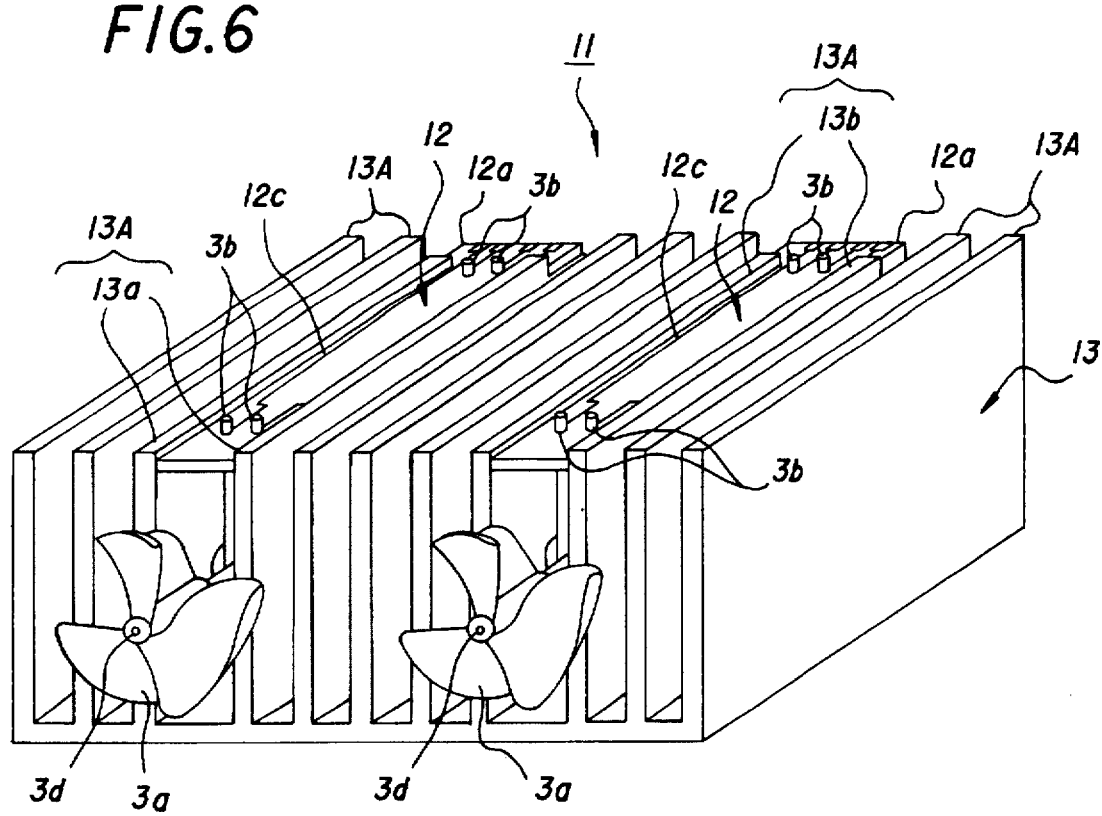
FIG. 6
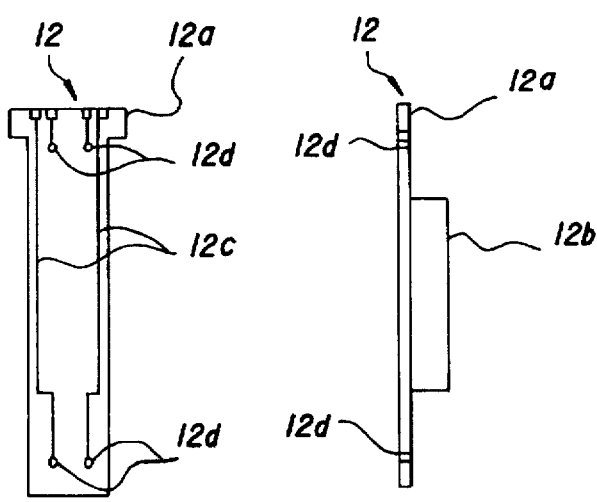
FIG. 7(a)
FIG. 7(b)

COOLING APPARATUS FOR ELECTRONIC COMPONENTS

BACKGROUND OF THE INVENTION

1. Field of the Invention

The present invention relates to a cooling apparatus for electronic components, such as semiconductor chips.

2. Description of the Related Art

Recently, the integration and the operation speed of electronics, in particular, such as computers and peripheral equipment, including measurement equipment, controllers and the like, are significantly improved because of "downsizing" and higher-speed processing. Thus, the integration and speed of semiconductor chips of the CPU and the like, i.e., the main electronic components, are increased and the electrical power consumption of the semiconductor chips is also increased, resulting in an increase in the calorific value thereof.

In general, the configuration of a cooling apparatus for the foregoing semiconductor chips is such that a heat sink having radiating fins is fixed to the top of a semiconductor chip and a motor provided with a fan, such as an axial fan, is mounted in the heat sink. According to this cooling apparatus, the radiating fins which radiate the heat of the semiconductor chip to the outside are compulsorily cooled by rotating the fan such that the cooled-air flow is circulated to the radiating fins.

To install the foregoing motor to a heat sink, first, the motor is fixed to a supporting board and then the supporting board is fixed to the heat sink by screwing or using an adhesive.

Further, a lead line is directly soldered to a motor terminal to supply power for the motor.

However, the foregoing conventional cooling apparatus has the following problems: Since the motor having the fan is fixed on the top of the heat sink, the total height of the semiconductor including the cooling apparatus necessarily increases, preventing miniaturization. Further, the foregoing assembling system, in which the motor is fixed to a supporting board and then the supporting board is fixed to the heat sink, is complicated and inefficient.

Furthermore, since the lead line is connected to the motor terminal, handling is inferior such that the lead line disturbs the assemblage and the soldering of the line may be occasionally detached as a result of careless operation.

The present invention provides a cooling apparatus for electronic components, the size of which apparatus is readily reduced and which may be easily assembled.

For solving the foregoing object, a preferred embodiment of the present invention consists of a cooling apparatus for electronic components comprising: a plurality of radiating fins being formed in a heat sink which is in contact with the electronic components; at least one pair of the radiating fins formed in parallel with one another; a motor for driving a fan to air-cool the electronic components, the motor fitting in a groove formed by the radiating fins such that the motor axis is oriented in the longitudinal direction of the groove; a motor-body support means provided on the radiating fins so as to support the motor fitting in the groove; a printed board connected to a terminal of the motor and set up on the upper ends of the radiating fins; and a holding ridge formed on the printed board for fitting in the groove so as to cooperate with the motor-body support in clamping the motor therebetween.

According to a cooling apparatus for electronic components of the present invention, a motor is clamped and fixed between motor-body supports only by fitting the motor in a pair of radiating fins of a heat sink and installing a printed board to the upper ends of the radiating fins. In this case, the motor can be accommodated within the height of the radiating fins.

Further, since a terminal of the motor directly connects to the printed board, no lead line is required. Furthermore, as is similar to electronic components, the heat generated in the motor is transmitted to the radiating fins, in which the motor fits, and radiated to the outside therefrom.

The cooling apparatus for electronic components preferably utilizes a printed board having a core base material comprising ceramic or a metal.

According to the cooling apparatus for electronic components of the present invention, although a majority of the heat transmitted through radiating fins is radiated from the surface thereof, a portion of the heat is transmitted from the upper ends of the radiating fins to a core base material of a printed board; the heat then rapidly conducts through the core base material toward the surface of the printed board, and is radiated from the whole surface thereof.

BRIEF DESCRIPTION OF THE DRAWINGS

FIG. 6 is a view illustrating a cooling apparatus for electronic components of the second embodiment of the present invention.

FIGS. 7(a) and 7(b) are a plan view and a side view, respectively, of a printed board of a cooling apparatus for electronic components of the second embodiment of the present invention.

DETAILED DESCRIPTION OF THE PREFERRED EMBODIMENTS

Figure 1:
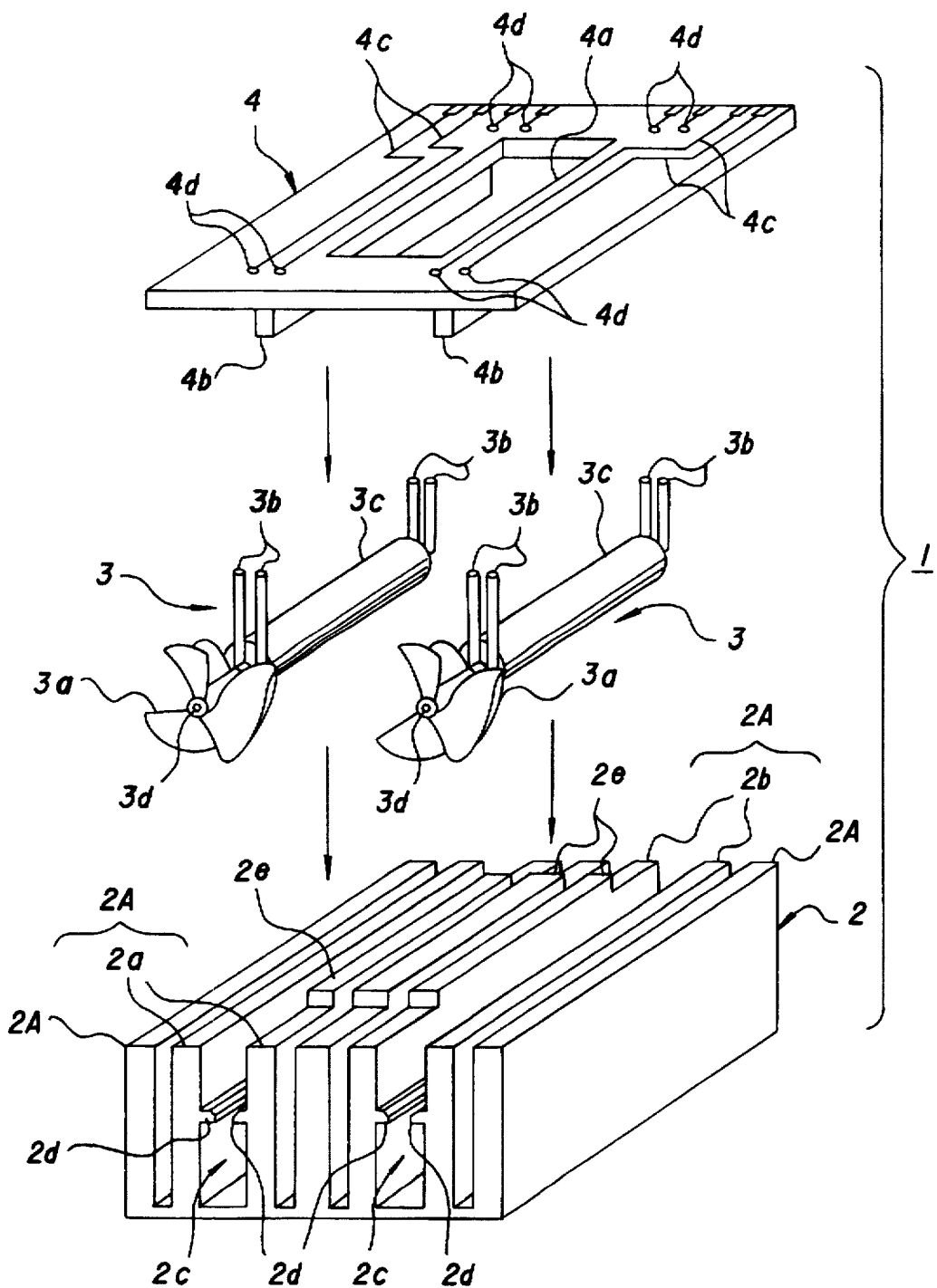
FIG. 1 is an exploded perspective view illustrating a cooling apparatus for electronic components of the first embodiment of the present invention.

A first embodiment of the present invention will be explained below with reference to FIGS. 1 to FIGS. 4(a) and 4(b).

A cooling apparatus 1, a heat sink 2, motors 3 and a printed board 4 are shown in the drawings.

Figure 2:
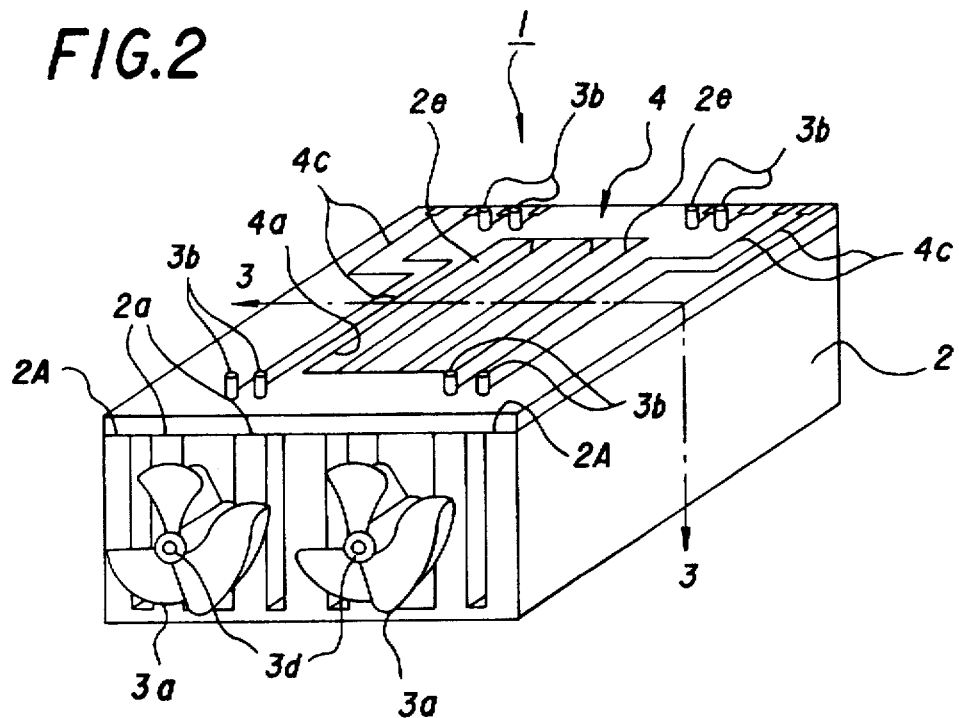
FIG. 2 is a perspective view illustrating a cooling apparatus for electronic components of the first embodiment of the present invention.
Figure 3:
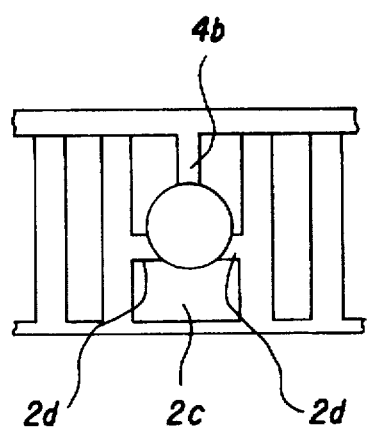
FIG. 3 is a section taken on line 3—3 in FIG. 2.

As is shown in FIGS. 1 to 3, the cooling apparatus 1 is composed as follows: a plurality of radiating fins 2A are provided for the heat sink 2 which is in contact with electronic components, such as semiconductor chips; two motors 3 are fixed to the radiating fins 2A to rotary-drive fans 3a for air-cooling the electronic components; and the printed board 4 to which terminals 3b of the motors 3 connect is fixed on the upper ends of the radiating fins 2A.

The heat sink 2 comprises the parallel plate radiating fins 2A which are made of ceramic or a metal and which are integrated at the lower portions thereof. Among the radiating fins 2A, two pairs of the radiating fins 2a and 2a, and 2b and 2b form corresponding grooves 2c such that 2a and 2a form one of the grooves 2c, and 2b and 2b form the other. The motors 3 fit in the corresponding grooves 2c so that the motor axis is in the longitudinal direction of the grooves 2c.

The radiating fins 2a, 2a, 2b, and 2b have a corresponding motor-body support 2d for supporting the motors 3 fitting in the corresponding grooves 2c. The motor-body supports 2d are formed such that they protrude inwardly from the corresponding radiating fins 2a, 2a, 2b and 2b, and extend in the shape of a ridge along the corresponding grooves 2c.

In addition, for positioning the printed board 4, ridges 2e are formed in the upper ends of three of the radiating fins 2A positioned in a center portion of the heat sink 2.

In this embodiment, stepping motors are used as the motors 3. The terminals 3b protruding upward are arranged at the front and back ends of cylindrical motor bodies 3c. At one end of each of the motor bodies 3c, an output axis 3d having a fan 3a protrudes along the axial direction of the corresponding motor body 3c.

An example of the printed board 4 is a so-called "porcelain enamel board" which is prepared as follows: a porcelain enamel layer is baked on a core base material made of ceramic or a metal, and thick film conductor ink is printed thereon, followed by sintering to form a conductive pattern. Further, a printed board composed of a core base material of a thermal setting resin, such as an epoxy resin, can be used. However, a metallic core base material is preferable, considering the heat accompanied with the high-density packaging of electronics, noise, or electromagnetic shielding.

Figure 4A:
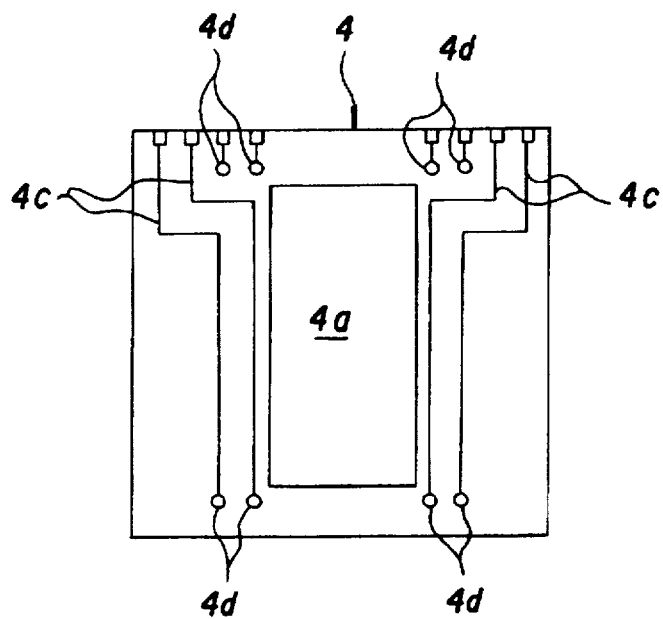
FIGS. 4(a) and 4(b) are a plan view and a side view, respectively, of a printed board of a cooling apparatus for electronic components of the first embodiment of the present invention.
Figure 4B:
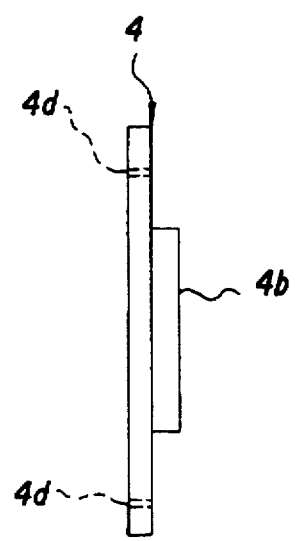

As is shown in FIGS. 4(a) and 4(b), the printed board 4 is a plate made of a ceramic material or the same metallic material as the heat sink 2, such as aluminum, copper, copper-tungsten alloys, aluminum nitride and the like. A space 4a, in which the ridges 2e of the heat sink 2 fit, is formed in the center portion of the printed board 4, and ridges 5b holding the motor bodies 3c of the motors 3 are installed on the bottom face of the printed board 4. In addition, on the top face of the printed board 4, wiring patterns 4c are printed for supplying power for the terminals 3b of the motors 3, and component holes 4d are formed such that the terminals 3b are allowed to pass through the corresponding component holes 4d to electrically connect to the wiring patterns 4c at the time of fixing the motors 3. For electrically insulating the terminals 3b from the core base material, the metallic component holes 4d have a coating treatment.

Next, the assembly procedure of the cooling apparatus 1 of the first embodiment will be described.

First, the motor bodies 3c are placed on the corresponding motor-body supports 2d set up in the corresponding grooves 2c of the heat sink 2.

The ridges 2e of the heat sink 2 fit in the space 4a of the printed board 4, and the motors 3 are fixed such that motor bodies 3c are clamped by the corresponding ridges 4b of the printed board 4 and the corresponding motor-body supports 2d. At that time, the terminals 3b of the motors 3 are allowed to pass through the corresponding component holes 4d from below the printed board 4 to electrically connect to the wiring patterns 4c, as is shown in FIG. 2.

In this cooling apparatus 1, the motors 3 are fixed and clamped between the printed board 4 and the corresponding motor body support means 2d only by installing the printed board 4 to the upper ends of the radiating fins 2A. In this case, the motors 3 can be accommodated within the height of the radiating fins 2A.

In addition, since the terminals 3b of the motors 3 directly connected to the printed board 4, no lead line is required. In addition, on the printed board 4, not only the wiring patterns 4c supplying electric power for electronic components but also the wiring patterns and devices supplying and controlling electric power for motors are mounted. So, the separated printed board of the wiring patterns and devices for motors is not necessary.

Further, in this cooling apparatus 1, the lower portion of the heat sink 2 is arranged to be in contact with electronic components. The heat from the electronic components is thereby transmitted to the radiating fins 2A from the lower portion of the heat sink 2 and the outgoing radiation efficiently proceeds particularly in the radiating fins 2a and 2b clamping the motors 3, since the cooling-air flow from the fans 3a is most effective therein.

Furthermore, although a majority of the heat being transmitted through the radiating fins 2A is radiated from the surface of the radiating fins 2A, a portion of the heat is transmitted from the upper ends of the radiating fins 2A to the core base material of the printed board 4, the heat then rapidly conducts through the core base material toward the surface of the printed board 4, and is radiated from the whole surface thereof.

Moreover, the heat generated in the motors 3 is transmitted to the fins 2A clamping the motors 3 and radiated to the outside from the fins 2A, similar to the electronic components.

The second embodiment of the present invention will be explained below with reference to FIGS. 5 to FIGS. 7(a) and 7(b).

A cooling apparatus 11, printed boards 12, and a heat sink 13 are shown in the drawings.

Figure 5:
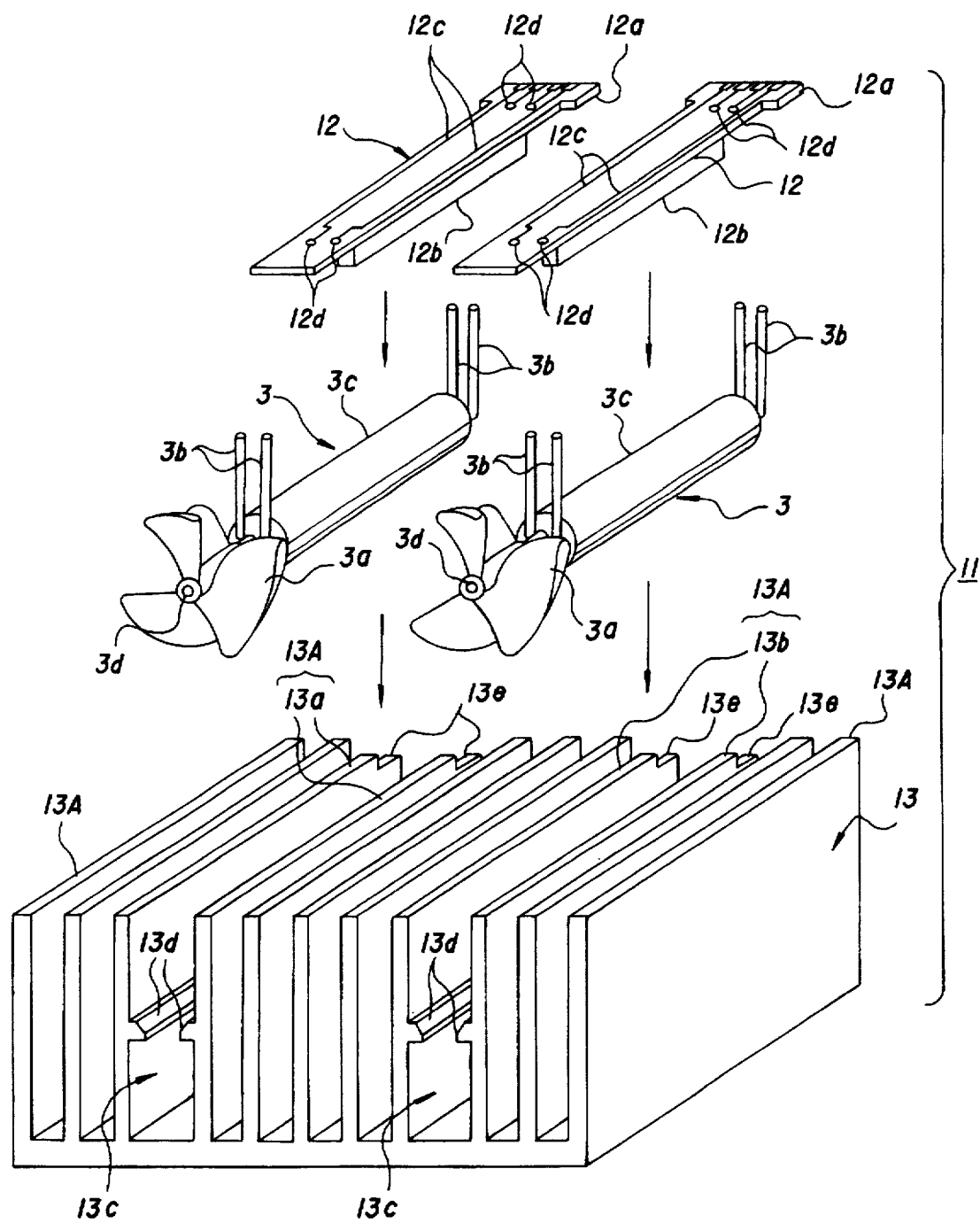
FIG. 5 is an exploded perspective view illustrating a cooling apparatus for electronic components of the second embodiment of the present invention.

As is shown in FIGS. 5 and 6, the second embodiment differs from the first embodiment, in which one printed board 4 is used, in the following respects: two printed boards 12 are separately set up on corresponding two motors 3; and they are fitted and fixed in corresponding grooves 13c formed by corresponding pairs of radiating fins 13a and 13a, and 13b and 13b, which fins clamp the corresponding motors 3 therebetween.

In other words, the printed boards 12 extend along the corresponding grooves 13c and are set up at a width similar to that of the grooves 13c; where one end of each of them is formed into a T-shaped wing 12a protruding to both sides thereof. Further, similarly to the first embodiment, ridges 12b holding the motor bodies 3c of the motors 3 are installed on the bottom faces of the printed boards 12. In addition, on the top faces of the printed boards 12, wiring patterns 12c are printed for supplying power for the terminals 3b of the motors 3, and component holes 12d are formed such that the terminals 3b are allowed to pass through the corresponding component holes 12d to electrically connect to the wiring patterns 12c at the time of fixing the motors 3. For electrically insulating the terminals 3b from the core base material, the metallic component holes 12d preferably have a coating treatment.

In addition, motor-body support means 13d are formed in the shape of a ridge in the corresponding grooves 13c, similarly to the first embodiment. Positioning notches 13e, to which the wings 12a of the printed boards 12 are positioned and engaged, are formed in the corresponding upper ends of one side end of the radiating fins 13a, 13a, 13b, and 13b.

Next, the assembly procedure of the cooling apparatus 11 of the second embodiment will be described.

First, similarly to the first embodiment, the motor bodies 3c are placed on the corresponding motor-body support means 13d set up in the corresponding grooves 13c of the heat sink 13.

The wings 12a of the printed boards 12 engage in the notches 13e of the heat sink 13, and the printed boards 12 fit in the grooves 13c. At that time, the motors 3 are fixed such that motor bodies 3c are clamped by the ridges 12b of the printed boards 12 and the motor-body supporting means 13d. The terminals 3b of the motors 3 are allowed to pass through the corresponding component holes 12d from below the printed boards 12 to electrically connect to the wiring patterns 12c, as is shown in FIG. 5.

In the cooling apparatus 11 of the second embodiment, the printed boards 12 are placed inside the radiating fins 13A such that they are fitted and fixed in the corresponding grooves 13c.

In the first embodiment, the upper portion of each of the grooves formed by the corresponding radiating fins 2A is closed by the printed board 4. Meanwhile, in the second embodiment, only the upper portions of the grooves 13c are closed and those of the other grooves are opened. Therefore, the outgoing radiation from each of the radiating fins 13A is further improved.

Although two motors are provided for one heat sink in the above embodiments, the present invention is not limited thereto. Motor-body supports of a heat sink and ridges of a printed board may be formed corresponding to a required number of motors.

In addition, the number and the extending direction of radiating fins may be set up according to various conditions. The positioning of a heat sink and a printed board, and the position and shape of the fitting portions may be suitably determined.

Although the motor-body supports are formed in the shape of a ridge, other shapes may be employed, provided that they can engage the motor bodies positioned above them. For example, steps having a width which is narrower than the diameter of the motor bodies may be provided on the radiating-fin grooves which clamp the motors.

We claim:

1. A cooling apparatus for electronic components comprising:

a heat sink adapted to be in contact with the electronic components;

a plurality of radiating fins formed on said heat sink, at least one pair of said radiating fins formed in parallel with one another;

a motor for driving a fan to air-cool the electronic components, said motor fitting in a groove formed by said radiating fins such that the motor axis is in a longitudinal direction of said groove;

motor-body support means provided on said radiating fins for supporting said motor fitting in said groove;

a printed board connected to a terminal of said motor and set up on the upper ends of said radiating fins; and a holding ridge formed on said printed board for fitting in said groove so as to cooperate with said motor-body support means in clamping said motor therebetween.

2. A cooling apparatus for electronic components as set forth in claim 1, wherein said printed board comprises a core base material comprising ceramic or a metal.

* * * * *